United States Patent [19]

Lee et al.

[11] Patent Number: 5,769,696
[45] Date of Patent: Jun. 23, 1998

[54] CHEMICAL-MECHANICAL POLISHING OF THIN MATERIALS USING NON-BAKED CARRIER FILM

[75] Inventors: Dawn M. Lee, Fremont; Subramanian Venkatkrishnan, Los Altos, both of Calif.

[73] Assignee: Advanced Micro Devices, Inc., Sunnyvale, Calif.

[21] Appl. No.: 388,057

[22] Filed: Feb. 10, 1995

[51] Int. Cl.$^6$ ..................................................... B24B 5/00
[52] U.S. Cl. .......................... 451/287; 451/285; 451/286; 451/288; 451/289; 451/41; 451/57; 451/66
[58] Field of Search .................................. 451/57, 66, 41, 451/285–290, 9, 288, 388, 286, 39, 397, 921, 364, 389

[56] References Cited

U.S. PATENT DOCUMENTS

| | | |
|---|---|---|
| 3,841,031 | 10/1974 | Walsh . |
| 3,911,562 | 10/1975 | Youmans . |
| 4,193,226 | 3/1980 | Gill, Jr. et al. . |
| 4,680,893 | 7/1987 | Cronkhite et al. .......................... 451/57 |
| 4,811,522 | 3/1989 | Gill, Jr. . |
| 4,944,836 | 7/1990 | Beyer et al. . |
| 5,104,828 | 4/1992 | Morimoto et al. ....................... 451/290 |
| 5,109,639 | 5/1992 | Kime, Jr. ................................ 451/539 |
| 5,193,316 | 3/1993 | Olmstead ................................ 451/286 |
| 5,245,794 | 9/1993 | Salugsugan . |
| 5,486,129 | 1/1996 | Sandhu et al. ........................... 451/290 |
| 5,533,924 | 7/1996 | Stroupe et al. .......................... 451/286 |
| 5,645,474 | 7/1997 | Kubo et al. .............................. 451/288 |

OTHER PUBLICATIONS

Ali, Iqbal et al, "Chemical–Mechanical Polishing of Interlayer Dielectric: A Review", *Solid State Technology*, Oct. 1994, pp. 63–68.

Kaufman, F.B. et al, "Chemical–Mechanical Polishing for Fabricating Patterned W Metal Features as Chip Interconnects," *The Electrochemical Society*, vol. 138, No.11, Nov. 1991, pp. 3460–3464.

"Rodel Planarization Systems: Slurries, Pads, Fixtures," RODEL Product Brochure, June. 1994, (4 pages).

"Rodel: Silicon Polishing Systems, Planarization Systems, Rigid Disk Systems, Glass Polishing Systems," RODEL Product Brochure, 1994, (12 pages).

*Primary Examiner*—Robert A. Rose
*Assistant Examiner*—George Nguyen

[57] ABSTRACT

Planarization of a patterned semiconductor wafer is effected by chemical-mechanical polishing using a carrier assembly comprising a carrier film adhesively bonded to a base plate, preferably by a pressure sensitive adhesive. Chemical-mechanical polishing is preferably conducted employing three phases of different pressures to prevent wafer slippage.

7 Claims, 4 Drawing Sheets

CHEMICAL-MECHANICAL POLISHING OF THIN MATERIALS USING NON-BAKED CARRIER FILM

TECHNICAL FIELD

The present invention relates an apparatus and method for planarizing a patterned semiconductor wafer by chemical-mechanical polishing. The invention has particular application in uniformly planarizing thin films of materials.

BACKGROUND ART

Semiconductor integrated circuits are manufactured by forming an array of separate dies on a common semiconductor wafer. During processing, the wafer is treated to form specified regions of insulating, conductive and semiconductor type materials. The ever increasing requirements for high density devices comprising wiring patterns with increasingly smaller distances between conductive lines pose a significant technological challenge. Conventionally, a wiring pattern comprising a dense array of conductive lines is formed by depositing a metal layer and etching to form a conductive pattern. A dielectric is then applied to the wiring pattern and planarization is effected as by chemical-mechanical polishing. However, it is extremely difficult to uniformly planarize dense patterns.

As shown in FIG. 1A, during an initial processing stage for forming an integrated circuit, a dielectric film 10 is deposited over a patterned conductive layer such as a metal 11. The object is to planarize steps 12 in dielectric layer 10 as shown in FIG. 1B. After deposition of layer 10, the portion thereof outside the trench must be removed. Such removal can be effected by plasma etching, or by a simplified faster and relatively inexpensive method known as chemical-mechanical planarization or polishing (CMP).

CMP is a conventional technique as disclosed in, for example, Salugsugan, U.S. Pat. No. 5,245,794; Beyer et al., U.S. Pat. No. 4,944,836; Youmans, U.S. Pat. No. 3,911,562. CMP is discussed in relation to earlier methods of fabricating metal interconnect structures by Kaufman et al., "Chemical-Mechanical Polishing for Fabricating Patterned W Metal Features as Chip Interconnects," J. Electrochem. Soc., Vol. 138, No. 11, November 1991, pp. 3460–3464. U.S. Pat. No. 4,193,226 and 4,811,522 to Gill, Jr. and U.S. Pat. No. 3,841,031 to Walsh relate to CMP apparatus. Various problems associated with CMP are discussed by Ali et al., "Chemical-mechanical polishing of interlayer dielectric: A review," Solid State Technology, Oct. 1994, pp. 63–68.

Basically, in employing a conventional CMP apparatus, wafers to be polished are mounted on a carrier assembly placed on the CMP apparatus. A polishing pad is adapted to engage the wafers carried by the carrier assembly. A chemical agent containing an abrasive, typically a slurry, is dripped onto the pad continuously during the polishing operation while pressure is applied to the wafer via the carrier assembly.

A typical CMP apparatus 100 is shown in FIG. 2 and comprises a rotatable polishing platen 102, polishing pad 104 mounted on platen 102, driven by microprocessor control motor (not shown) to spin at about 10 to about 100 RPM. Wafer 106 is mounted on the bottom of a rotatable carrier assembly 108 so that a major surface of wafer 106 to be polished is positionable to contact the underlying polishing pad 104. Wafer 106 and carrier assembly 108 are attached to a vertical spindle 110 which is rotatably mounted in a lateral robotic arm 112 which rotates the carrier assembly 108 at about 10 to about 75 RPM in the same direction as platen 102 and radially positions the carrier assembly on the platen. Robotic arm 112 also vertically positions carrier assembly 108 to bring wafer 106 into contact with polishing pad 104 and maintain an appropriate polishing contact pressure. A tube 114 opposite carrier assembly 108 above polishing pad 104 dispenses and evenly saturates the pad with an appropriate cleaning agent 116, typically a slurry.

As shown in FIG. 3, polishing pad 31 rotates in the direction of arrow 35, while carrier assembly 32 rotates in the direction of arrow 34, similar to the direction of arrow 35, but at a different speed than the polishing pad, while a downward force is applied to the carrier assembly 32 at 33 in a direction perpendicular to carrier assembly 32.

A typical carrier assembly is illustrated in FIGS. 4A and 4B, and comprises base plate 40 to which a carrier film 42 is affixed. Retaining ring 41, which serves to maintain the wafer in position during polishing, is affixed to base plate 40. Vacuum conduits 43 penetrate the base plate and aid in retaining the wafer to the carrier assembly during transport to and from the polishing pad.

In use, a wafer 52, as shown in FIG. 5A, is retained against the carrier film 51 within retaining ring 53. The retaining ring is typically made of plastic and affixed to the carrier base 50, which is typically made of metal, preferably stainless steel, by means of screws (not shown). A downward force 55 is applied perpendicular to the carrier assembly which rotates in the direction of arrow 56, as shown in FIG. 5B, similar to the direction of rotation of arrow 57 of polishing pad 54, but at a different speed.

Carrier films are typically made of polymeric material and commercially available from manufacturers of CMP auxiliary equipment, such as Rodel in Newark, Del. In accordance with conventional practices, the carrier film is affixed to the metal base plate by baking at elevated temperatures and pressures. In use, a downward vertical force is applied to the carrier base plate to generate the requisite energy for removing a surface film, whether metal, non-metal or semiconductor material. Typically, the magnitude of the downward force depends upon the particular equipment, other process parameters and material being removed. When pressures up to about 4 psi are employed, conventional carrier films perform fairly adequately. However, we have recognized a problem attendant upon employing pressures greater than about 4 psi, such as pressures above about 4 psi to about 12 psi. As a result of the relative rotational velocity between the carrier assembly and the polishing pad, we have found that the strain imposed on the carrier film is increased considerably at pressures in excess of about 4 psi. As a result of such increased strain, tears occurs in the baked carrier film which expose the metal base plate. Consequently, polishing occurs too rapidly in the area of tears, thereby resulting in damaged wafers which must be scrapped at considerable expense. We have found that areas directly below tears where the metal base plate is exposed polish much more rapidly than other areas of the patterned wafer, often to such an extent that the silicon substrate is exposed. There is no practical way to determine, during processing, at which point the carrier film undergoes tearing other than by observing damaged wafers.

DISCRIPTION OF THE INVENTION

An object of the present invention is a CMP apparatus and method for planarizing a surface on a patterned wafer at high pressures, employing a carrier assembly comprising a carrier film which is capable of functioning for long periods of time without tearing, wherein the planarized surface exhibits improved uniformity.

Another object of the present invention is a CMP apparatus and method for planarizing a surface on a patterned wafer at high pressures without overpolishing any area of the patterned wafer.

Additional objects, advantages and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

According to the present invention, the foregoing and other objects are achieved in part by a method of manufacturing a semiconductor device, comprising adhering a carrier film to a base plate of a carrier assembly with an adhesive; placing a patterned wafer adjacent to the carrier film; and planarizing the patterned wafer by CMP.

Another aspect of the invention is an improvement in a conventional method of chemical-mechanical polishing a patterned wafer using a carrier assembly comprising a base plate and a carrier film, the improvement comprising adhering the carrier film to the base plate with an adhesive without the application of heat.

A further aspect of the present invention is a CMP polishing apparatus comprising a carrier assembly containing a carrier film adhesively bonded to a base plate without the application of heat.

Another aspect of the present invention is a carrier assembly for CMP a patterned wafer, which carrier assembly comprises a carrier film adhesively bonded to a base plate without the application of heat.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1A:
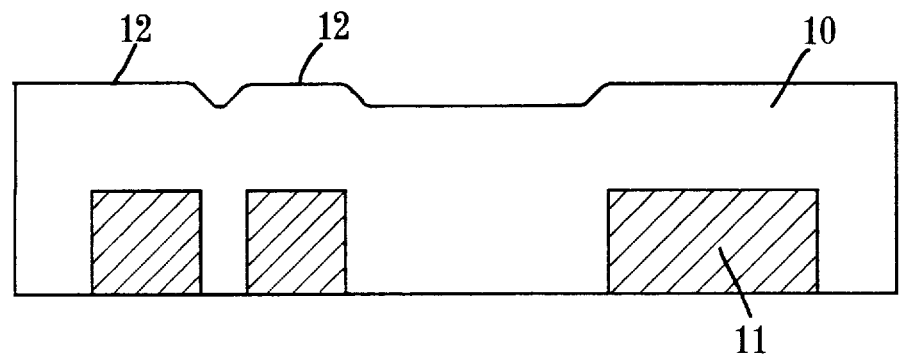
FIG. 1A schematically illustrates a covered pattern prior to planarization.
Figure 1B:
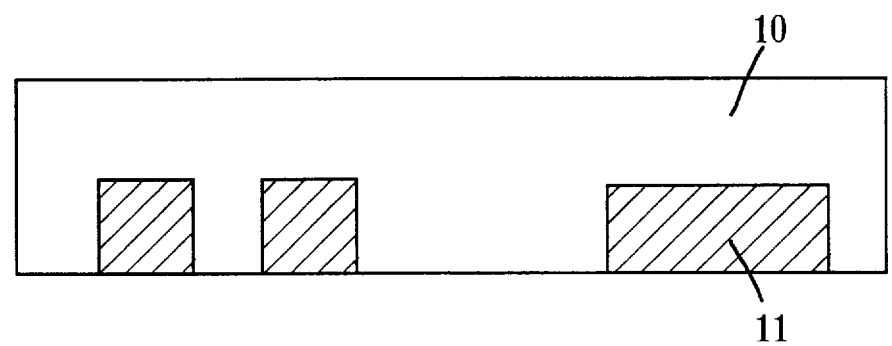
FIG. 1B schematically illustrates a planarized pattern.
Figure 2:
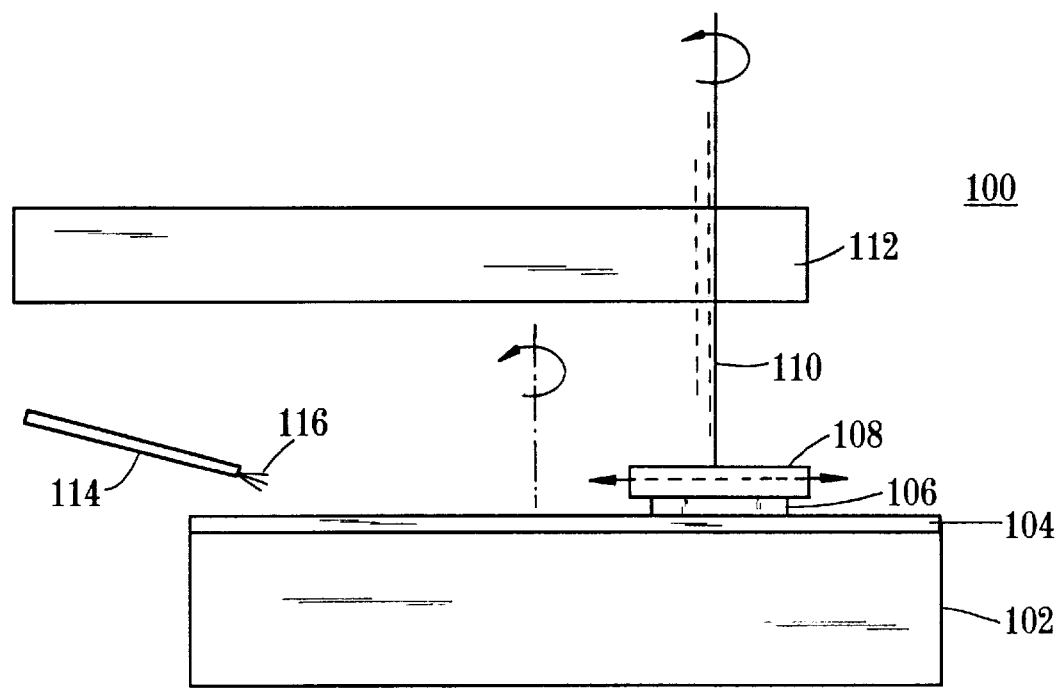
FIG. 2 schematically illustrates a typical chemical-mechanical polishing machine.
Figure 3:
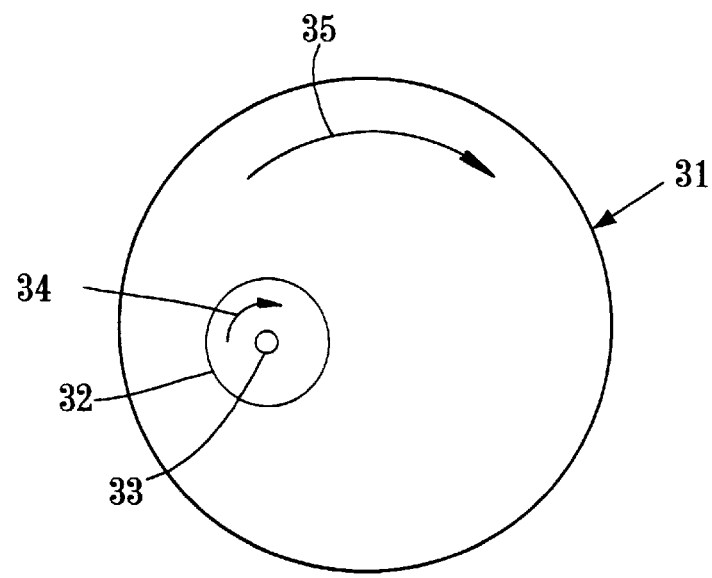
FIG. 3 schematically illustrates a typical CMP arrangement.
Figure 4A:
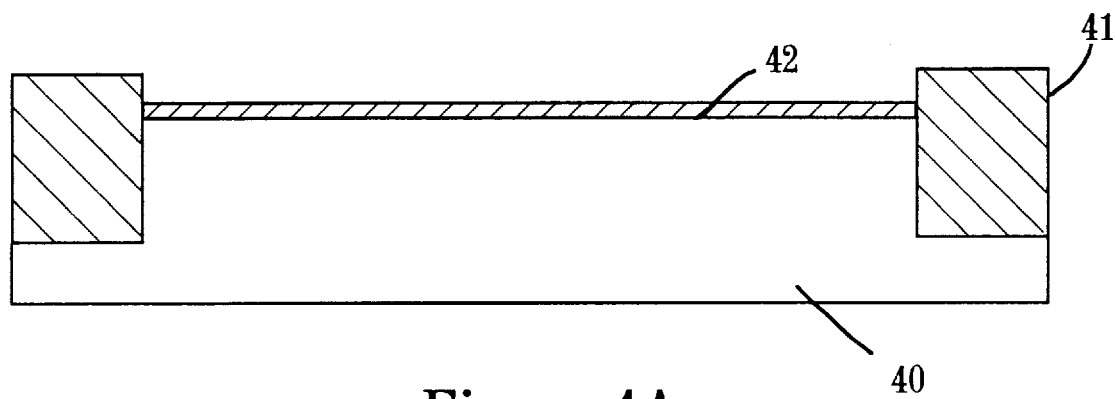
FIGS. 4A and 4B depict a conventional carrier assembly.
Figure 4B:
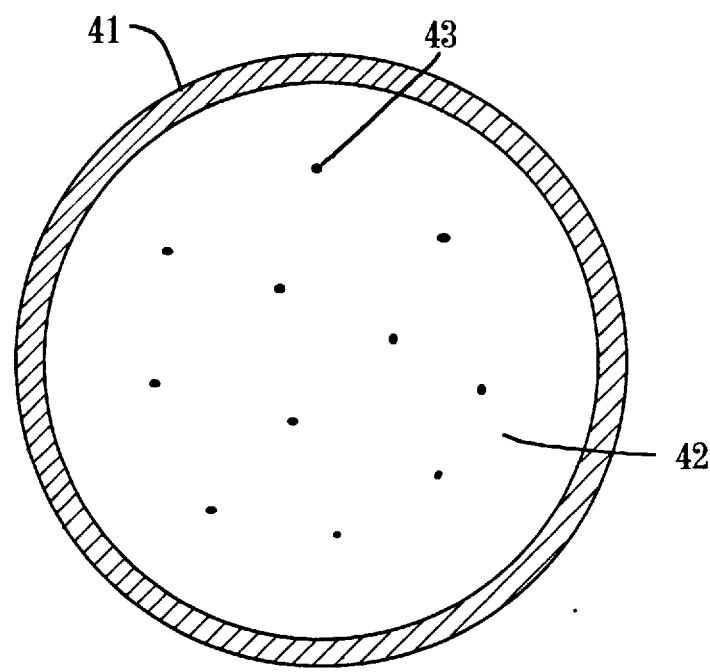
Figure 5A:
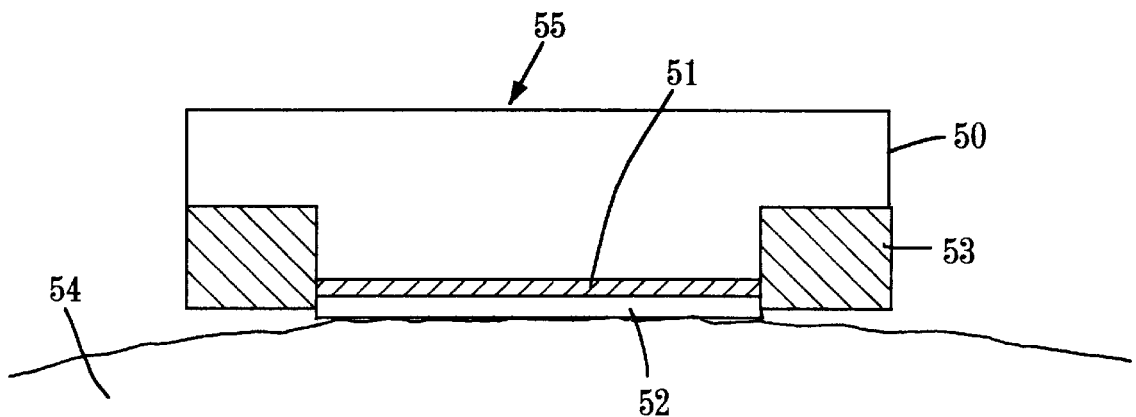
FIGS. 5A and 5B schematically illustrate a CMP operation.
Figure 5B:
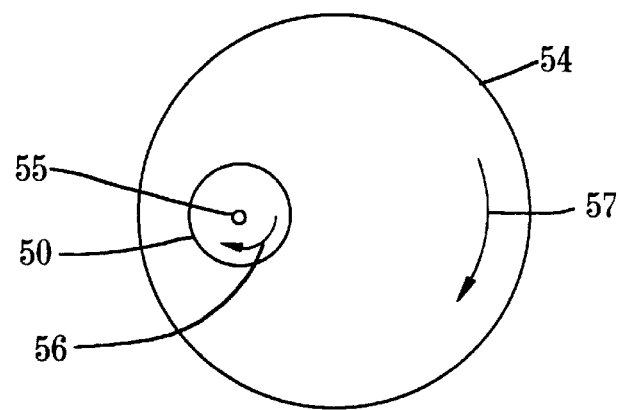

The present invention addresses the problem of carrier film tearing which exposes the metal base plate to the wafer thereby resulting in overpolishing of the patterned layer and, often, removal of the complete pattern in an area below the tear completely through to the silicon wafer. This tearing and overpolishing problem typically occurs when employing a downward vertical pressure in excess of about 4 psi; however, such elevated pressures are desirable for high production throughput. After extensive investigation and experimentation, we have discovered that the tearing and overpolishing problems at high CMP pressures can be overcome by adhering the carrier film to the metal base plate by means of an adhesive, rather than by baking the carrier film onto the base plate at high temperatures and pressures. Preferably, the adhesive is a pressure sensitive adhesive such as any of those commercially available, such as acrylic-based pressure sensitive adhesives.

In practicing the present invention, a two-sided pressure sensitive adhesive can be adhesively applied to the carrier film and the composite carrier film and pressure sensitive adhesive applied to the metal base plate. In an alternative embodiment, the pressure sensitive adhesive is applied directly to the base plate and a carrier film applied to the pressure sensitive adhesive. According to the present invention, the carrier film is adhered to the metal base plate without the application of heat, i.e., it is not baked onto the base plate.

The carrier film employed in the present invention can be any of those commercially available. It has been found that a carrier film comprising a porous polymeric material is suitable for use in the present invention. Polymeric carrier films sold by Rodel of Newark, Del., such as R-200, have been found particularly suitable. The CMP carrier assembly of the present invention is similar to those conventionally employed in the art, apart from the inventive contribution disclosed herein which resides in adhering the carrier film to the base plate by means of an adhesive, preferably a pressure sensitive adhesive, without baking.

In conducting CMP according to the present invention, a conventional CMP apparatus is employed, comprising a polishing pad to which a polishing agent is applied, such as a slurry. The CMP carrier assembly of the present invention desirably contains a retaining ring to ensure proper positioning of the wafer, and preferably comprises vacuum passages for retention and transport of the wafer. When providing vacuum passages in the base plate, vacuum passages are also provided in the adhesive employed to adhere the carrier film to the base plate and in the carrier film.

Thus, according to the present invention, a patterned wafer is planarized by CMP employing a carrier assembly comprising a carrier film adhered to the metal place with an adhesive, preferably a pressure sensitive adhesive, at pressures in excess of about 4 psi, such as above about 4 psi to about 12 psi, without tearing of the carrier film, for long periods of time. It has been found that the pressure and time of CMP depends upon the particular type of wafer undergoing planarization. A pressure of about 8 to 12 psi can be applied for an appropriate period of time required to effect substantially complete planarization of most patterned wafers.

We have found that in conducting CMP employing a carrier assembly having a carrier film adhesively bonded to the metal base plate, wafer slippage sometimes occurs at the beginning of CMP when the vacuum is released and/or at the completion of CMP wherein the wafer sticks to the polishing pad because of the surface tension between the polishing pad and the wafer. After extensive investigation and experimentation, we discovered that the utilization of a preliminary polishing phase prevents initial wafer slippage. The pressure and duration of the preliminary phase are optimized in a particular situation for speed and to prevent such initial wafer slippage. Preferably, the pressure and duration of the initial polishing phase are less than the pressure and duration of the main polishing phase. For example, we found that a preliminary polishing phase performed at a pressure of about 2 to about 10 psi, preferably about 4 to about 8 psi, for a period of time in excess of 0.5 seconds, prior to the main CMP phase, avoids initial wafer slippage.

After further extensive investigation and experimentation, we found that a final polishing phase performed subsequent to the main polishing phase eliminates slippage at the completion of the main polishing phase. The pressure and duration of the final polishing phase are optimized in a particular situation for speed and to prevent such subsequent wafer slippage. Preferably, the pressure and duration of the final polishing phase are less than the pressure and duration of the main polishing phase. For example, we found that a final polishing phase performed at a pressure of about 1 to about 6 psi, preferably at about 1 to about 4 psi, for a period of time in excess of about 0.5 seconds, avoids subsequent wafer slippage by preventing the wafer from sticking to the polishing pad.

Thus, in accordance with the present invention, planarization can be successfully effected without tearing or overpolishing by employing a carrier assembly having a carrier film adhesively bonded to the metal base plate. Advantageously, CMP is conducted in three phases comprising: a main polishing phase during which most of the planarization is actually effected; a preliminary polishing phase, prior to the main polishing phase, to prevent initial wafer slippage; and a final polishing phase, subsequent to the main polishing phase to prevent subsequent wafer slippage. The pressures and durations of the preliminary and final polishing phases are minimized in order to maximize wafer throughput. Advantageously, the pressure applied during the preliminary and final polishing phases is less than the pressure applied during the main polishing phase. Preferably, the duration of the preliminary and final polishing phase is shorter than the duration of the main polishing phase. The preliminary polishing phase is preferably conducted in excess of 0.5 seconds at a pressure of about 2 to about 10 psi, preferably about 4 to about 8 psi. The main polishing phase is preferably conducted at a pressure and for a period of time for substantially complete planarization. For example, we found that the main polishing phase can advantageously be conducted a pressure above about 4 to about 12 psi, preferably about 8 to about 12 psi, for a period of time necessary to effect substantially complete removal of the surface film and planarization. The final polishing phase is preferably conducted at a pressure of about 1 to about 6 psi preferably about 1 to about 4 psi for a period of time in excess of 0.5 seconds.

In accordance with the present invention, a wafer containing a conductive pattern and a dielectric layer deposited thereon was planarized to remove 4000Å by CMP polishing employing a preliminary polishing phase of about 6 psi for about 10 seconds, a main polishing phase of about 10 psi for about 57 seconds, and a final polishing phase of about 1 psi for about 10 seconds.

The present invention can be practiced employing otherwise conventional CMP techniques and apparatus. For example, the CMP apparatus disclosed in the previously mentioned Gill, Jr. or Walsh patents can be employed in the practice of the present invention. The polishing pad employed in the claimed invention can be any of those which are conventionally employed in CMP, such as those comprising a cellular polyurethane pad. The cleaning agent employed in the claimed invention can be any of those conventionally employed in CMP processing, preferably a slurry.

The improved CMP technique of the present invention can be employed to planarize various types of surfaces on a wafer, including conductive and insulating materials, such as oxides, nitrides, polysilicon, single crystalline silicon, amorphous silicon, and mixtures thereof. The substrate of the wafer containing the conductive or non-conductive material is generally a semiconductor material, such as silicon.

In conducting the present inventive method, the pressures and durations of the preliminary, main, and final polishing phases are adjusted depending upon the particular CMP apparatus employed, CMP consumables used and particular patterned wafer undergoing planarization. The pressure is optimized for production speed and the duration selected to effect the desired degree of removal to effect uniform planarization. The pressures and durations for the preliminary and final polishing phase are selected to prevent wafer slippage prior and subsequent to the main polishing phase, respectively, and to maximize wafer throughput.

The present invention involving the use of a CMP carrier assembly comprising a carrier film adhesively bonded to the metal base plate without baking advantageously enables a carrier film to be employed for an extended period of time without requiring change and, hence, downtime, thereby simplifying manufacturing and improving reliability.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A method of manufacturing a semiconductor device, comprising:
    adhering a porous polymeric carrier film to a base plate of a carrier assembly with an adhesive without the application of heat;
    placing a patterned wafer adjacent to the carrier film;
    planarizing the patterned wafer by chemical-mechanical polishing;
    applying a pressure of about 2 to about 10 psi, in excess of about 0.5 seconds, during a preliminary polishing phase, prior to the main polishing phase, to reduce wafer slippage; and
    conducting a main polishing phase by applying a pressure of about 6 to about 10 psi to the patterned wafer via the carrier assembly for a period of time sufficient to effect substantially complete planarization.

2. The method according to claim 1, comprising applying a pressure of about 4 to about 8 psi during the preliminary polishing phase.

3. The method according to claim 1, further comprising applying a pressure of about 1 to about 6 psi, in excess of about 0.5 seconds, during a final polishing phase, subsequent to the main polishing phase to remove wafer slippage.

4. The method according to claim 3, comprising applying a pressure of about 1 to about 4 psi during the final polishing phase.

5. A method of manufacturing a semiconductor device, comprising:
    adhering a porous polymeric carrier film to a base plate of a carrier assembly with an adhesive without the application of heat;

placing a patterned wafer adjacent to the carrier film; and planarizing the patterned wafer by chemical-mechanical polishing, wherein chemical-mechanical polishing is conducted in three separate phases.

6. The method according to claim 5, wherein the three phases comprise a preliminary polishing phase to reduce wafer slippage, a subsequent main polishing phase, and a final polishing phase to reduce wafer slippage, wherein the pressure applied during the preliminary and final polishing phases is less than the pressure applied during the main polishing phase.

7. The method according to claim 6, wherein the preliminary and final polishing phases are shorter in duration than the main polishing phase.

* * * * *